(12) United States Patent
Jablonski et al.

(10) Patent No.: US 8,673,049 B2
(45) Date of Patent: Mar. 18, 2014

(54) LOW-TEMPERATURE SINTERED SILVER NANOPARTICLE COMPOSITION AND ELECTRONIC ARTICLES FORMED USING THE SAME

(75) Inventors: Gregory A. Jablonski, Yardley, PA (US); Michael A. Mastropietro, Bridgewater, NJ (US); Kimitaka Sato, Okayama (JP); Hiromasa Miyoshi, Okayama (JP); Hidefumi Fujita, Okayama (JP)

(73) Assignees: DOWA Electronics Materials Co., Ltd., Tokyo (JP); PChem Associates, Inc., Bensalem, PA (US)

( * ) Notice: Subject to any disclaimer, the term of this patent is extended or adjusted under 35 U.S.C. 154(b) by 0 days.

(21) Appl. No.: 13/321,675

(22) PCT Filed: Aug. 27, 2010

(86) PCT No.: PCT/JP2010/064556
§ 371 (c)(1),
(2), (4) Date: Nov. 21, 2011

(87) PCT Pub. No.: WO2012/026033
PCT Pub. Date: Mar. 1, 2012

(65) Prior Publication Data
US 2012/0177897 A1 Jul. 12, 2012

(51) Int. Cl.
*C22C 5/00* (2006.01)
(52) U.S. Cl.
USPC .......................................... 75/252; 428/195.1
(58) Field of Classification Search
USPC .......................................... 428/195.1; 75/252
See application file for complete search history.

(56) References Cited

U.S. PATENT DOCUMENTS

| 5,286,417 A | * | 2/1994 | Mahmoud et al. | ....... 252/519.33 |
| 2002/0068145 A1 | * | 6/2002 | Ducros et al. | ................. 428/100 |
| 2007/0144305 A1 | | 6/2007 | Jablonski et al. | |
| 2011/0236709 A1 | | 9/2011 | Jablonski et al. | |

FOREIGN PATENT DOCUMENTS

| CN | 1513591 | 7/2003 |
| CN | 1569366 | 1/2005 |
| JP | 2005-200604 | 7/2005 |
| JP | 2005-310703 | 11/2005 |

(Continued)

OTHER PUBLICATIONS

Chinese Office Action for corresponding Chinese Application No. 201080039335.4, dated May 29, 2013.

*Primary Examiner* — Mark Ruthkosky
*Assistant Examiner* — Ian Rummel
(74) *Attorney, Agent, or Firm* — Greenblum & Bernstein, P.L.C.

(57) ABSTRACT

A silver nanoparticle composition is provided which is possible to be sintered through sintering at a low temperature in a short time and to form silver electro conductive film and wiring which is favorable for adhesion to a substrate and low in resistance, and articles using the same are provided. The silver nanoparticle composition is provided, wherein a main component of a solvent is water, a pH of the composition is within a range of 5.3 to 8.0, a silver nanoparticle included in the composition is protected by an organic acid or a derivative thereof, and the content of the organic acid or the derivative thereof with respect to silver is 2 to 20% by mass.

16 Claims, 5 Drawing Sheets

(a)

(b)

(56) References Cited

FOREIGN PATENT DOCUMENTS

| JP | 2009-521598 | 6/2009 |
| JP | 2009-161808 | 7/2009 |
| JP | 2010-80442 | 4/2010 |
| JP | 2010-512653 | 4/2010 |
| JP | 2010-116625 | 5/2010 |
| WO | 2008/048316 | 4/2008 |
| WO | 2008/071061 | 6/2008 |

* cited by examiner

| CLASSIFICATION | 0 | 1 | 2 | 3 | 4 | 5 |
|---|---|---|---|---|---|---|
| STATE |  |  |  |  |  | WORSE THAN 4 |

(a)

(b)

(a)

(b)

LOW-TEMPERATURE SINTERED SILVER NANOPARTICLE COMPOSITION AND ELECTRONIC ARTICLES FORMED USING THE SAME

TECHNICAL FIELD

The present invention relates to a silver nanoparticle composition which is excellent in adhesion to a base material and can be used to form a metal film or a conductive circuit at a low temperature in a short time.

BACKGROUND ART

A major wiring method of a printed circuit board which is frequently used in electric products includes a method for etching foil of metal such as aluminum and copper. According to the conventional method, since materials are not the least lost in parts removed by etching, the method is not preferable from the viewpoint of effective utilization of the materials.

Further, since waste liquid, and the like, are generated due to etching, this method loads environment greatly. In recent years, from the viewpoint of resource saving and environment measure, wiring forming according to another method has been extensively investigated.

Among the new wiring forming technologies investigated, "printed electronics," in which an existing printing technology is applied to form a wiring and a conductive film, have been expected to easily obtain those desired in a large amount, and therefore particularly have attracted attention.

As remarkable applications of the printed electronics, a print CPU, a print light, a print tag, an all-print display, a sensor, a print circuit board, an organic solar battery, an electronic book, a nanoimprint LED, a liquid-crystal display, a PDP display, a print memory, and RF-ID have been investigated. The scope of applicability is very wide.

The feasibility of such printed electronics largely depends on a metal component expressing conductivity. Therefore, in order to further promote the printed electronics technology, a metal particle which is a conductive particle has been widely investigated. From the viewpoint of a fine-wiring field which has great expectations of the print method and low-temperature sintering property, in particular, a metal nanoparticle having a nano-order particle diameter has been widely investigated (see Patent Documents 1 and 2).

When the metal has nano-size, it has been known that it has properties which greatly differ from physical properties in a bulk state. Since this nanosized particle has very high activity, the particle is unstable as it is. For this reason, as the nanoparticle, a nanoparticle having a covering layer mainly including organic matter such as a surfactant on the surface has been usually provided. As the composition, a composition, in which metal nanoparticles covered with the surfactant are dispersed in an organic solvent, has been mainly provided.

The surface of the metal nanoparticle is covered with organic matter such as a surfactant, as described above, to prevent sintering and aggregation of the particles. Use of a surfactant having a long chain prevents sintering and aggregation of the particles and is possible to ensure independency and storage stability of the particles in the liquid. Even if the metal is a nanosized particle, when a surfactant having a high molecular weight is configured around the particle, it is necessary to perform treatment at a high temperature for a time as long as 30 minutes to 1 hour to remove or degrade the surfactant on the surface of the particle during formulation of a metal film. This makes it difficult to apply the metal nanoparticle to a low-cost heat-labile wiring board, and therefore the probability of application using the metal nanoparticles may be reduced. Further, from the viewpoint of saving energy, this is inappropriate.

The metal nanoparticles are often dispersed in an organic solvent such as decane and terpineol. Since the organic solvent may cause environmental contamination, attention has to be paid to disposal. Since an organic component of the evaporated organic solvent diffuses easily, when a large amount of the organic solvent is used for treatment, it is necessary to install a local exhaust device. Of cause, it may damage our bodies. For this reason, from the viewpoint of environment and operation, it is desirable that a dispersion medium, in which the organic solvent is not a main component, be used.

When the application of the metal nanoparticles is a conductive material, the metal species of the metal nanoparticles is most suitably silver from the viewpoint of low resistance of metal, high acid resistance, low melting point and easiness of sintering, and basis metal price.

Based on the above knowledge, the present inventors have developed a technology for metal nanoparticles which has low-temperature sintering property and can form a metal film in a short time, and disclosed the content of the technology in the foregone application (see Patent Document 3).

PRIOR ART DOCUMENTS

Patent Documents

Patent Document 1: Japanese Patent Application Laid-open No. 2005-200604
Patent Document 2: Japanese Patent Application Laid-open No. 2005-310703
Patent Document 3: International Patent Application WO2008/048316 pamphlet

DISCLOSURE OF INVENTION

Problem to be Solved by the Invention

The present inventors have shown that even if treatment is performed using a silver nanoparticle composition disclosed in Patent Document 3 at a low temperature in a short time, a conductive film having low resistance and favorable film adhesion can be obtained. Specifically, when the composition is applied to a base material by a simple printer in a laboratory and heat treated by a dryer, or the like, at 140° C. or higher for 30 seconds or more, the conductive film shows favorable conductivity.

When in fact, a low-cost and low heat-resistant substrate such as a PET film and paper is subjected to printing and heat treatment using roll to roll continuous print which is usually used for industry, it is desired that the printing speed be 30 m/min or more. In such a high-speed treatment, even if a heat-treating furnace provided in a printer is set to 140° C., a base material itself is transferred from the heat-treating furnace before it is heated to 140° C. When the temperature is set to a high temperature, there are problems such as deformation and burning of the base material caused by heat, rather than baking of the silver nanoparticle composition. Therefore, insufficient sintering in a heat-treating process makes it difficult to obtain favorable conductivity.

For this reason, it is required to develop a composition capable of obtaining favorable resistance even in treatment at a lower temperature in a short time. In view of the above problems, it is an object of the present invention to provide a silver nanoparticle composition capable of obtaining favorable resistance and adhesion at a low temperature in a short time.

It is another object of the present invention to provide a silver thin film and wiring formed using the above silver nanoparticle composition, and an RF-ID antenna, an RF-ID antenna inlet, an EMI shield, and an electronic circuit formed using them.

Means for Solving Problem

The following configuration can solve the above problems. In a first invention, a silver nanoparticle composition is used, wherein a main component of a solvent is water, a pH of the composition is within a range of 5.3 to 8.0, a silver nanoparticle included in the composition is protected by an organic acid or a derivative thereof, and a content of the organic acid or the derivative thereof is within a range of 2 to 20% by mass with respect to silver.

Hereinafter, other features of the present invention will be described. In a second invention, the silver nanoparticle composition of the first invention is used, wherein a content of the silver nanoparticle with respect to the entire content of the composition is within a range of 15 to 75% by mass.

In a third invention, the silver nanoparticle composition of the first or second invention is used, wherein a content of an ammonia component present in the composition with respect to the composition is more than 0.1% by mass.

In a fourth invention, the silver nanoparticle composition of any of the first to third inventions is used, wherein a content of a nitric acid component present in the composition with respect to the composition is more than 0.1% by mass.

In a fifth invention, the silver nanoparticle composition of any of the first to fourth inventions is used, wherein a primary particle diameter of the silver nanoparticle to be measured by a transmission electron microscope is equal to or smaller than 100 nm.

In a sixth invention, the silver nanoparticle composition of any of the first to fifth inventions is used, which includes a polymer obtained by polymerizing a monomer having a vinyl group.

In a seventh invention, the silver nanoparticle composition of any of the first to sixth inventions is used, wherein the organic acid or the derivative thereof is a carboxylic acid having 5 to 8 carbon atoms or a derivative thereof.

In an eighth invention, the silver nanoparticle composition of any of the first to seventh inventions is used, wherein the organic acid or the derivative thereof is heptanoic acid or a derivative thereof.

In a ninth invention, the silver nanoparticle composition of any of the sixth to eighth inventions is used, wherein the polymer obtained by polymerizing a monomer having a vinyl group includes at least one or more of a vinyl chloride homopolymer, a vinyl chloride copolymer, a vinyl acetate homopolymer, and a vinyl acetate copolymer.

In a tenth invention, the silver nanoparticle composition of any of the first to ninth inventions is used, which includes a polymer having a glass transition temperature ($T_g$) of 0° C. or higher and 100° C. or lower.

In an eleventh invention, the silver nanoparticle composition of any of the first to tenth inventions is used, which includes a water-dispersible polymer having at least one or more of an OH group, a polyoxyethylene glycol group, and a polyethylene glycol group.

In a twelfth invention, the silver nanoparticle composition of the eleventh invention is used, which includes a polymer having a urethane bond.

In a thirteenth invention, the silver nanoparticle composition of any of the first to twelfth inventions is used, wherein a surface resistivity of a silver thin film obtained by applying the silver nanoparticle composition of any of the first to eleventh inventions to a base material and subjecting it to heat treatment in air at 60° C. for 15 seconds is equal to or less than 100 Ω/square.

In a fourteenth invention, a silver thin film or a silver wiring formed using the silver nanoparticle composition of any of the first to thirteenth inventions is used.

In a fifteenth invention, an RF-ID antenna is used, wherein an antenna part of an RF-ID is formed from a silver wiring formed by applying the silver nanoparticle composition of any of the first to thirteenth inventions to a base material and firing the wiring to be converted into silver.

In a sixteenth invention, an RF-ID inlet using the antenna of the fifteenth invention is used.

In a seventeenth invention, an EMI shield is used, wherein a grid part of the EMI shield is formed from a wiring which is a silver wiring formed by firing a wiring formed from the silver nanoparticle composition of any of the first to thirteenth inventions to be converted into silver.

In an eighteenth invention, an electronic circuit is used, wherein a wiring formed by a printing method from the silver nanoparticle composition of any of the first to thirteenth inventions is fired to be converted into silver and form a silver wiring.

Effect of the Invention

The present invention provides a silver nanoparticle composition which is excellent in an industrially required level of low-temperature short-time sintering property and adhesion to a substrate, and makes it possible to form a silver conductive film and wiring having low resistance, and articles using the same.

BEST MODE(S) FOR CARRYING OUT THE INVENTION

Figure 1:
FIG. 1 is a view illustrating a criterion of adhesion evaluation.
Figure 1:
Figure 1:
Figure 1:
Figure 1:

<Silver Nanoparticle Composition>
<Solvent>

A solvent of the silver nanoparticle composition (hereinafter simply referred to as "composition") in the present invention is composed mainly of water. As used herein, the phrase "is composed mainly of" means that a rate of water in the solvent of the composition is 50% by mass or more. To such a composition, an auxiliary solvent in a total of 50% by mass or less may be added.

<Auxiliary Solvent>

As the auxiliary solvent, one kind of polar solvent which includes typical derivatives of such as alcohol, polyol, and ether, or combinations of a plurality of them can be used. This makes it possible to adjust the solubility of additives and improve the wettability with a substrate.

<pH>

The pH of the composition is preferably 5.3 to 8.0. The composition of the present invention has an emulsion structure of water which is a main solvent, and the organic acid and the silver nanoparticles. The organic acid and derivative thereof are essentially low in solubility in water. However, these organic acids each have a feature, in which increasing pH of the solvent raises their solubility. When the pH is equal to or less than 5.2, the organic acid and derivative thereof are not almost dissolved in the solvent. Therefore, an excess amount of the organic acid and derivative thereof agglutinate the particles one another. Accordingly, since the particles are agglutinated or a viscosity of the composition remarkably increases, the composition is not suitable for a coating. When the pH is equal to or greater than 8.1, the solubility of the organic acid and derivative thereof in water serving as a solvent is too high. Therefore, the amount of the organic acid and derivative thereof around the particles is insufficient for dispersing the particles one another. Accordingly, since the particles are agglutinated or form bonds, the composition is not suitable for a coating.

<Silver Nanoparticle>

The silver nanoparticles according to the present invention can be formed by a wet method. The kinds of manufacturing method are not particularly limited as long as the particles can be formed by this method.

The diameter of the silver nanoparticle to be measured by a transmission electron microscope (TEM) is equal to or less than 100 nm, and preferably, equal to or less than 50 nm. When the particle has a diameter larger than this range, low-temperature sintering property to be expected as a silver nanoparticle makes it difficult to be imparted, and it is not preferable. As used herein, "diameter of silver nanoparticle" is referred to as "primary particle average diameter of silver nanoparticle," and the detailed measurement method will be described below.

A silver concentration in the composition can be used in a range of 15 to 75% by mass, preferably 30 to 75% by mass, and more preferably 40 to 75% by mass. From the viewpoint of sintering at a low temperature and firing in a short time, it is preferable that the solvent amount be small and the silver concentration be high. However, since the high silver concentration increases the viscosity of the composition, a suitable range of the silver concentration may be adopted depending on printing methods. In spray printing methods, only a composition having low viscosity can be printed. In this case, since a low silver concentration is advantageous, the silver concentration can decrease.

<Organic Acid>

The surface of the silver nanoparticle in the composition in the present invention is covered with an organic acid having 5 to 8 carbon atoms or a derivative thereof. The organic acid or derivative thereof exerts effects of a so-called protectant, which prevents sintering and aggregation between the particles, and maintains a moderate distance between the particles. When the number of carbon atom is more than 8, the organic acid or derivative thereof has a boiling point which is near or very higher than the heat-resistant temperature of a low heat-resistant substrate. Therefore, since thermal energy and time for dissociation from the silver nanoparticle are sufficiently required, it is not suitable for applications which need sintering property at a low temperature in a short time. In order to suppress dispersion stability of particles in a liquid and aggregation of particles in a room-temperature region during storage, a moderate intermolecular distance and thermal stability of the organic acid and derivative thereof is required. For this reason, the organic acid or derivative thereof preferably has 5 to 8 carbon atoms, and is more preferably carboxylic acid. It is most preferably heptanoic acid.

The content of the organic acid or derivative thereof with respect to silver is preferably within a range of 2 to 20% by mass. When the content of the organic acid or derivative thereof is less than 2% by mass, the effects as a protectant remarkably decrease, and aggregates are produced, whereby low-temperature sintering property and dense property of a conductive film deteriorate. Therefore, it is not preferable. When the content is more than 20% by mass, sintering at a low temperature in a short time is inhibited, and therefore it is not preferable. This is because the organic acid and derivative thereof have a boiling point higher than that of water as a main solvent.

<Nitric Acid Component>

The nitric acid component in the composition acts to promote decomposition of a surfactant, a dispersant, and another additive resin during heating such as drying and firing processes after application of the composition to a substrate. For this reason, too low concentration of the nitric acid component causes low-temperature sintering property to deteriorate to make it difficult to form a film having favorable conductivity on a low heat-resistant substrate such as a PET substrate.

When a nitrate salt is used as a silver salt which is a raw material, the nitric acid component is supplied from the nitrate salt. When another silver salt is used, the nitrate component may be supplied as nitric acid or another nitrate salt after synthesis of the particles.

A nitrate ion concentration in the composition obtained above is more than 0.1% by mass, preferably equal to or more than 0.2% by mass, and more preferably equal to or more than 0.3% by mass.

<Ammonia Component>

An ammonia component is included in the composition obtained above in a content of more than 0.1% by mass, preferably equal to or more than 0.2% by mass, and more preferably equal to or more than 0.3% by mass. When it is out of this range, a secondary aggregation diameter of silver nanoparticle ink increases to remarkably increase sedimentation of ink, a coated film itself becomes uneven, and conductivity of a film after firing deteriorates. Therefore, it is not preferable. This ammonia component is caused by alkali and a reducing agent during the synthesis of the silver nanoparticles, and by ammonia which is added to adjust pH after the reaction.

The nitric acid and ammonia components in the composition can be adjusted by adding ammonia and nitric acid so that the above pH range is achieved. When the nitric acid and ammonia components are included in an amount equal to or more than a fixed amount, ion strength becomes too high. Therefore, it has been confirmed that the silver particles are aggressively aggregated. For this reason, the nitric acid component is included in a content equal to or less than 5% by mass, and preferably equal to or less than 3% by mass, and the ammonia component is included in a content equal to or less than 2% by mass, and preferably equal to or less than 1.5% by mass.

<Adhesion Improving Material>

It is preferable that the composition in the present invention include a polymer obtained by polymerizing a monomer having a vinyl group to increase the adhesion of a conductive film to a base material. A polymer to be added may be a water-soluble polymer which can be directly dissolved in a solvent, latex which is a system (emulsion) in which resin fine particles are dispersed in an aqueous solvent, or the like. The form of the polymer is not limited. The polymer can be suitably used as long as it is dispersed in a solvent. The polymer is also referred to as a water-dispersible polymer.

Whether or not the water-dispersible polymer is one that is obtained by polymerizing a monomer having a vinyl group can be determined by FT-IR analysis, FT-Raman analysis, or thermal decomposition GCMS.

The polymer obtained by polymerizing a monomer having a vinyl group is preferably any of a vinyl chloride homopolymer, a vinyl chloride copolymer, a vinyl acetate homopolymer, and a vinyl acetate copolymer, and the composition preferably includes one or more kinds of these polymers. The polymers are high in adherence to silver, and thus are suitable for increasing adhesion to a base material. Further, since the polymers are chemically stable, characteristics thereof in the composition are also stable during use and storage.

An added amount of the polymer obtained by polymerizing a monomer having a vinyl group is 0.5 to 10% by mass, preferably 1 to 8% by mass, and more preferably 1 to 7% by mass with respect to the entire composition. When the added amount is less than 0.5% by mass, the adhesion is not sufficient, while when it is more than 10% by mass, conductivity of the formed coated film is adversely affected. Therefore, this is not preferable.

<Thickener (Thickening Material)>

In order to appropriately adjust viscosity, a resin (hereinafter, "thickening material" and "thickener" are synonymously used) can be added. The resin to be added is preferably a water-dispersible polymer which can be stably dispersed in water serving as a main solvent. Further, the polymer can have at least one or more of an OH group, a polyoxyethylene glycol group, and a polyethylene glycol group.

The water-dispersible polymer may be the same as the previous polymer having a vinyl group. In this case, the polymer may be a polymer having at least one or more of an OH group, a polyoxyethylene glycol group, and a polyethylene glycol group, in addition to a vinyl group. Further, the polymer may be added as a polymer differing from the polymer having a vinyl group. Furthermore, polymers each having an OH group, a polyoxyethylene glycol group, or a polyethylene glycol group may be separately added. Since the polymer has these groups, the polymer may have a favorable dispersibility in the solvent of the composition of the present invention, and thus express a function of a thickening agent.

Whether or not the water-dispersible polymer includes an OH group, a polyoxyethylene glycol group, or a polyethylene glycol group can be determined by FT-IR analysis, FT-Raman analysis, or thermal decomposition GCMS.

It is suitable that the polymer having at least one or more of an OH group, a polyoxyethylene glycol group, and a polyethylene glycol group be one having a urethane bond. Since the polymer having a urethane bond is chemically stable, a thickening effect in the solvent of the composition of the present invention can be stably imparted for a long period of time.

Whether or not the water-dispersible polymer includes a urethane bond can be determined by FT-IR analysis, FT-Raman analysis, or thermal decomposition GCMS.

The added amount of the above water-dispersible polymer is more than 0% by mass and less than 10% by mass, preferably 0.1 to 5% by mass, and more preferably 0.2 to 3% by mass with respect to the entire composition. The added amount is preferably a minimum amount to allow the polymer to have a rheological property suitable for printing. Since the rheological property suitable for printing significantly varies depending on a printing method (flexographic printing, gravure printing, and screen printing), printing conditions (printing speed and substrate), and the like, the rheological property needs to be optimized appropriately so as to satisfy the conditions. When the polymer is excessively added, sintering of silver nanoparticle between particles is inhibited, and the polymer enters gaps between the particles. Since resistance in the entering portions is increased, the conductivity is reduced, and therefore this is not preferable.

<$T_g$ of Included Polymer>

As described above, the composition can include polymers depending on the applications thereof, and the polymers preferably have a high glass transition temperature ($T_g$). In general, in an adhesive field, use of a polymer having a low $T_g$ expresses adhesion at a lower temperature, and therefore it is known that the use of the polymer having a low $T_g$ is suitable for achievement of adhesion.

However, the present inventors have found that when the polymer having a low $T_g$ is added in a composition using silver nanoparticles, the polymer adheres to the surface of the silver nanoparticle due to adhesion of the polymer before sintering of the silver nanoparticles, and as a result, the action inhibits sintering, to impart adhesion and not to impart low-resistance characteristics.

Therefore, the $T_g$ of the polymer to be added is preferably within a range of 0° C. or more and 100° C. or less. When the $T_g$ is lower than 0° C., the sintering of the silver nanoparticles is inhibited not to impart low resistance. Therefore, it is not preferable. When the $T_g$ is higher than 100° C., the sintering of the nanoparticles is promoted and adhesion of resins in sintering at a low temperature in a short time is insufficient. Therefore, favorable adhesion to a base material cannot be ensured.

In order to improve adhesion to a base material, it is particularly important that a polymer having $T_g$ within this range should be used as the polymer to be added since the polymer has strong adhesiveness to silver particles at $T_g$ or higher. The polymer may be added to a composition without particularly limited to high $T_g$ within the range as long as the polymer is one having a function in which the polymer is dispersed in a solvent of the composition to control the viscosity of the composition like a thickener, and having weak adhesiveness to the surface of the silver nanoparticle.

The $T_g$ of the polymer can be determined by DSC (differential scanning calorimeter), DTA (differential thermal analyzer), or TMA (thermomechanical measuring device). Further, since a $T_g$ of a homopolymer is described in various documents (polymer handbook, etc.), a $T_g$ of a copolymer can be determined by the following equation (1) from $T_{gn}$ (K) of various homopolymers and mass fractions ($W_n$) of monomer.

$$(1/T_g) = (W_1/T_{g1}) + (W_2/T_{g2}) + \ldots + (W_n/T_{gn}) \quad (1),$$

wherein $W_n$ is the mass fraction of each monomer and $T_{gn}$ is $T_g$ (K) of homopolymer of each monomer.

<Resistance Value>

The silver nanoparticle composition of the present invention is characterized in that the surface resistivity of a silver thin film obtained by after application of the composition to a base material, heat-treating the composition in air at 60° C. for 15 seconds is equal to or less than 100 Ω/square.

As the base material, a PET base material having high versatility and cheaper paper base material are demanded. In the case of the PET base material, when heat treatment at 140° C. is performed, shrinkage increases, and therefore there is a problem of dimensional stability. In the case of the paper base material, since heat resistance is low, it is known that heat treatment decreases moisture in the base material to largely decrease the strength. Therefore, it is desirable that by heat treatment at a lower temperature in a shorter time, a conductivity can be imparted.

In order to achieve this object, it is desirable that the treatment at 120° C. or lower for 30 seconds or less, and preferably at 100° C. or lower for 30 seconds or less be performed to obtain a favorable conductive film. As a substance which expresses conductivity under a temperature region of about 150 to 200° C., resin-hardening silver paste has been previously known. The silver nanoparticle composition of the present invention was confirmed that the heat treatment at 60° C. for 15 seconds was performed to show a resistance value as favorable as a surface resistivity of 100 Ω/square or less. This shows excellent low-temperature short-time sintering property, in which a conductive film can be formed on a base material having very low heat resistance such as thermal paper.

Accordingly, a silver film or wiring having such a high conductivity can be formed by applying or pattern printing the composition on the base material, and sintering the base material at a low temperature in a short time.

Figure 2:
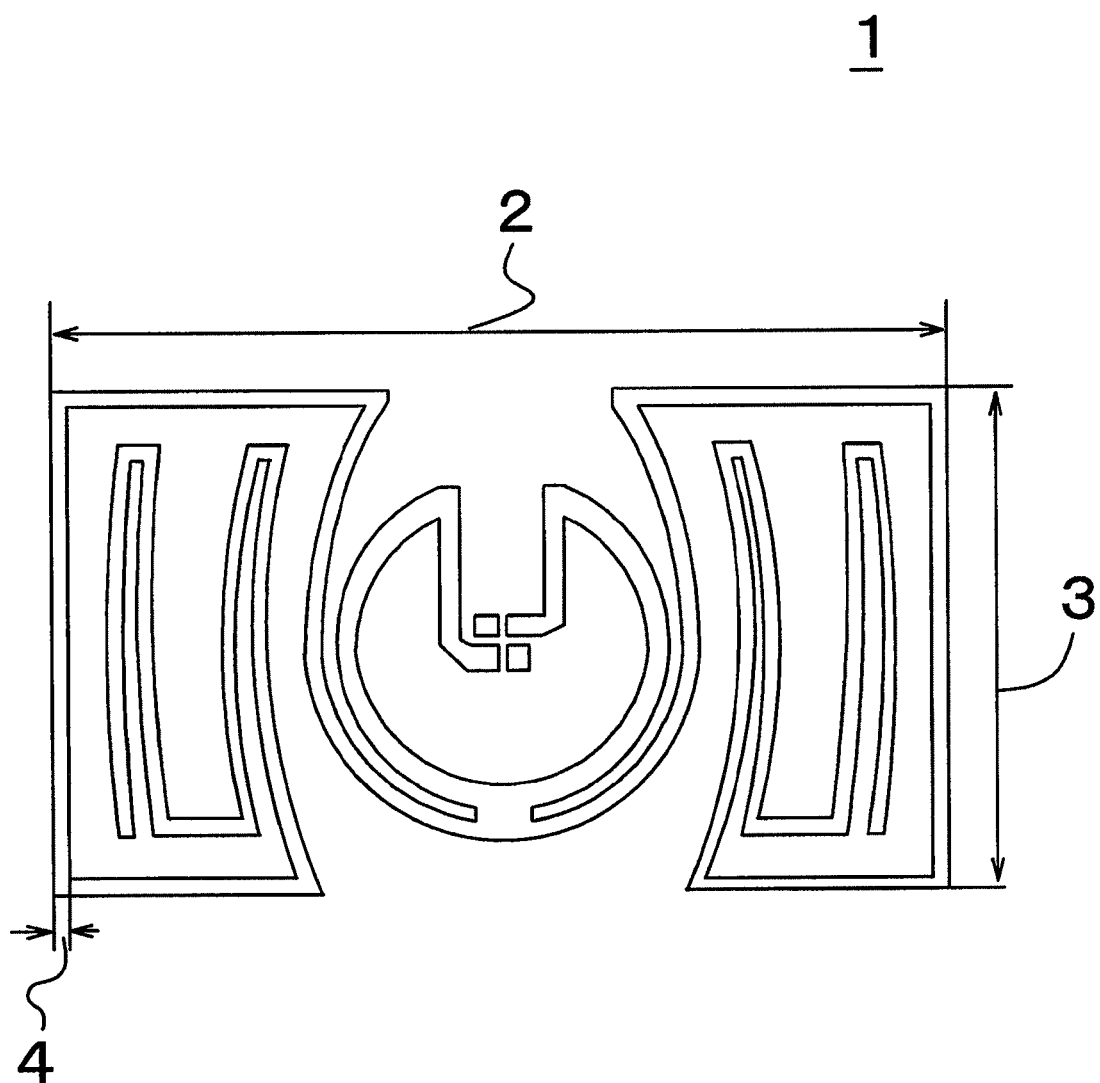
FIG. 2 is a view illustrating an example of the outline of an RF-ID antenna.

Printed articles having such the conductivity can be used as a wiring, an RF-ID (Radio Frequency Identification) antenna, and an RF-ID inlet using the same. FIG. 2 shows an RF-ID antenna 1 formed by a conductivity pattern using the silver nanoparticle composition of the present invention. This is an RF-ID antenna having an entire length (2) of 32 mm, an entire width (3) of 18.5 mm, and a line width (4) of 0.7 mm. A substrate is manufactured on PET having a thickness of 60 μm using the silver nanoparticle composition of the present invention under firing conditions of 80° C. for 30 seconds. The resistance of the line is 35 Ω.

Figure 3:
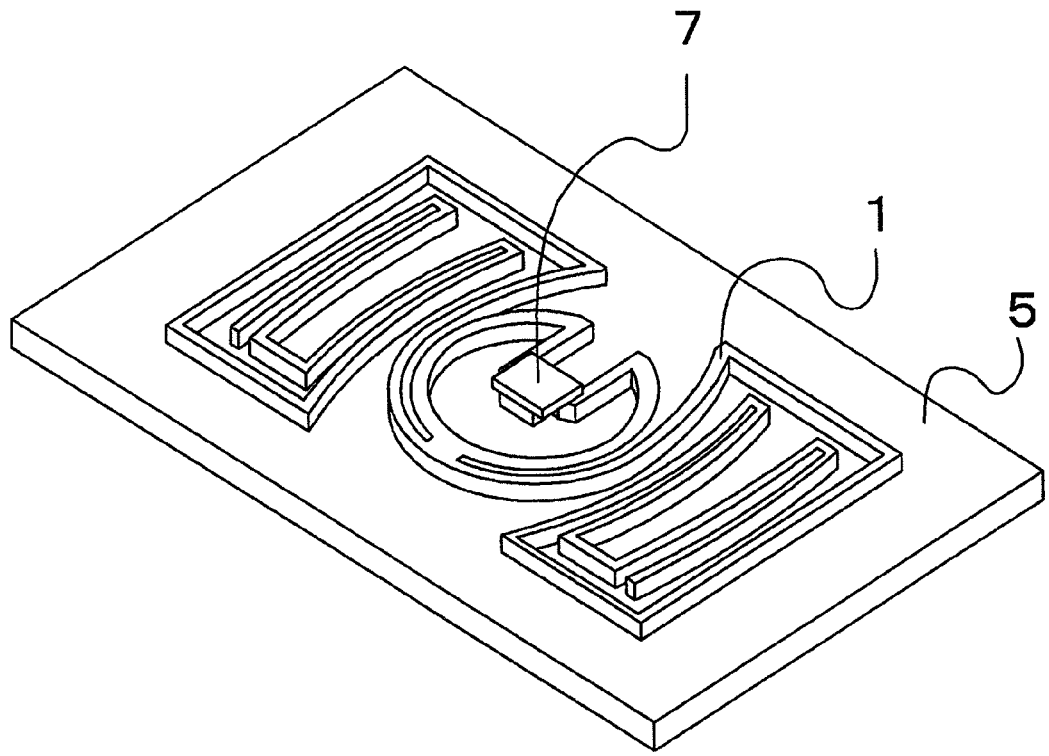
FIG. 3 is a cross sectional view of an RF-ID inlet.
Figure 3:
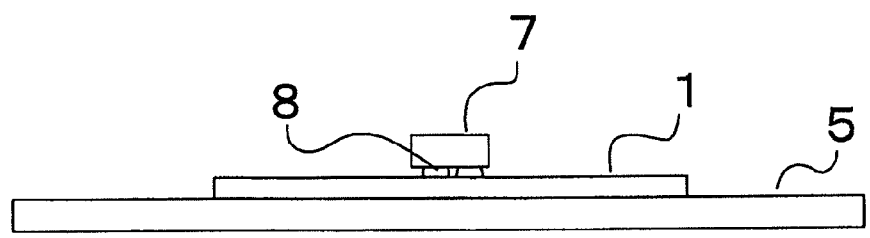

The RF-ID antenna and IC can be bonded through a bump to manufacture an RF-ID inlet. FIG. 3 shows a perspective view, in which an IC 7 is installed in the RF-ID antenna 1 formed on a substrate 5 (FIG. 3(a)) and a side view thereof (FIG. 3(b)). The IC 7 is connected with the RF-ID antenna 1 through a bump 8.

Figure 4:
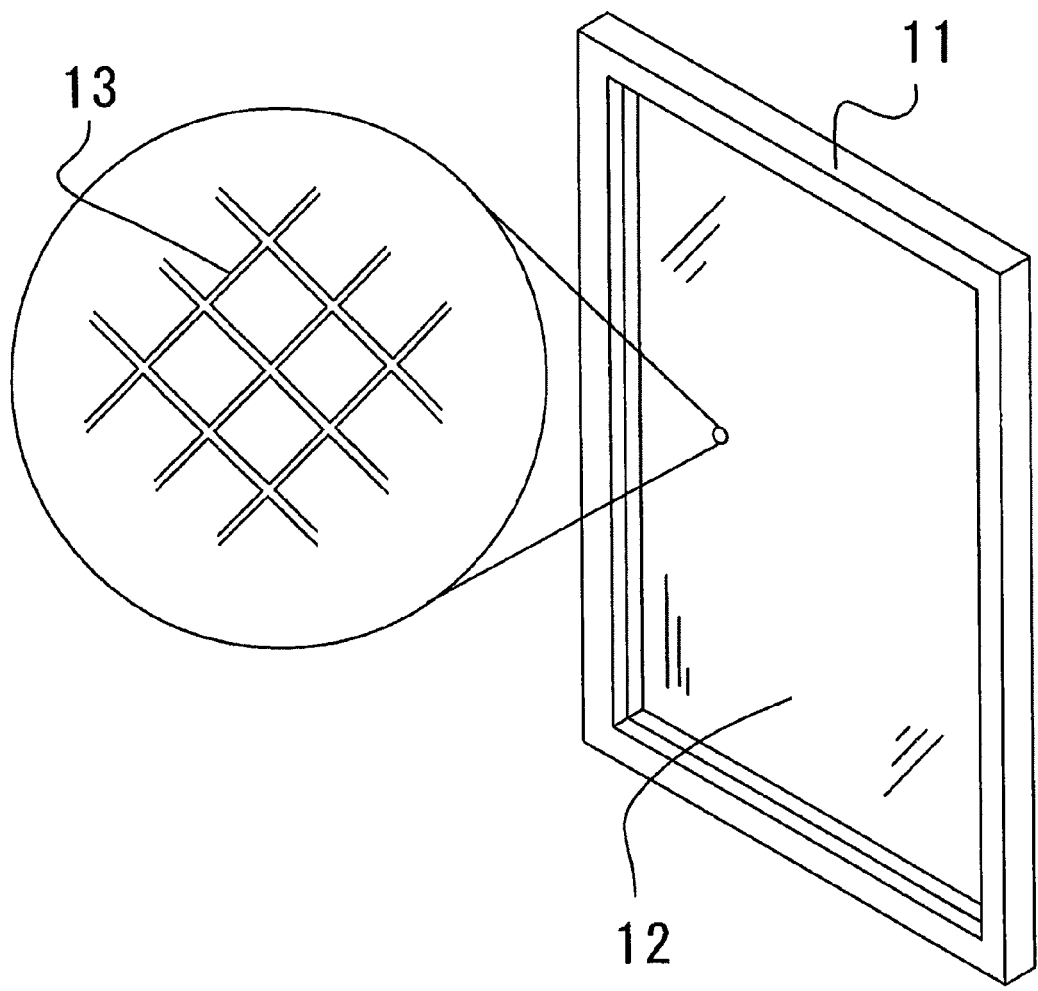
FIG. 4 is a view illustrating an example of an EMI shield.

The silver nanoparticle composition of the present invention can be used for an EMI shield (Electromagnetic Interference Shield). FIG. 4 shows a schematic view of an EMI shield 10 in the present invention. A frame 11 is an aluminum chassis, and a base material 12 attached to the center of the frame 11 is a transparent seal (polycarbonate). A conductive pattern 13 having a width of 35 μm is formed in a grid pattern on this base material, and the pattern is formed by the silver nanoparticle composition of the present invention. The EMI shield has a total light transmittance of 72% and a surface resistivity of 1.0 Ω/square.

<Manufacture of Silver Nanoparticles>

A method for manufacturing silver nanoparticles according to the present invention will be described. The method for manufacturing silver nanoparticles of the present invention is characterized in that the composition is manufactured without typically required processes such as filtration and drying. Since the composition is obtained without filtration and drying processes, a silver nanoparticle composition excellent in dispersibility and low-temperature sintering property can be obtained. Further, by removing these processes, production facilities can try to be simplified.

<Preparation of Raw Material Solution>

The silver nanoparticles according to the present invention can be obtained by preparing three kinds of solutions in advance, and sequentially mixing them. First, each solution will be sequentially described.

(Solution A)

Aqueous ammonia and an organic acid are dissolved in ion-exchanged water.

(Solution B)

A reductant for reducing silver ions is diluted with ion-exchanged water, or a reductant in a solid state at a normal temperature is dissolved in ion-exchanged water. The reductant is sufficient to have reducing ability capable of reducing silver ions in the aqueous solution. As the reductant, one kind of hydrazine, hydrazine hydrate, sodium borohydride, lithium borohydride, ascorbic acid, primary amine, secondary amine, tertiary amine, and aluminum lithium hydride, or a combination of a plurality of kinds thereof can be properly selected.

(Solution C)

A water-soluble silver salt of the above-described silver species is dissolved in ion-exchanged water.

For example, in the case of silver, silver nitrate and the like can be used as a silver salt. In addition, an acetate, carboxylate, or sulfate salt, a chloride, a hydrate, or the like can be selected. When a salt selected at this case is difficult to be dissolved in water at a normal temperature, a solution is warmed, or a solubilizing agent may be added in a range where the reaction is not impaired.

<Reaction Process>

A reaction vessel is in advance charged with a predetermined amount of ion-exchanged water and set to a predetermined temperature. To the reaction vessel, the solution A is added, followed by the solution B, and the solution C sequentially to cause a reaction.

At this time, the solution C is prepared so that the silver concentration in the reaction vessel is 0.3 to 0.9 mol/L, and preferably 0.4 to 0.7 mol/L. When the silver concentration is lower than the above-described concentration, the amount of the silver nanoparticles obtained after the reaction is small and productivity deteriorates, and therefore it is not preferable. When it is higher than the above-described concentration, the reaction is promoted very aggressively, is difficult to be controlled, and becomes uneven, and therefore it is not preferable.

At this time, the reaction temperature (temperature of the reaction solution) is normal temperature to 70° C.

<Separation Process>

The obtained reaction solution is separated by spontaneous precipitation into a supernatant and a reaction product. At this time, it is preferable that the reaction solution be left for at least half a day, and preferably left to such a degree that a roughly upper half of the solution in volume is the supernatant. The obtained product is separated by decantation into a product and a supernatant, and thus a concentrate of the silver nanoparticles can be obtained. In order to shorten the time, a centrifuge and the like may also be used.

The composition of the present invention is characterized in that the obtained concentrate is converted into a composition as it is without washing. Since washing causes notable aggregation of particles, it is not preferable. In the conventionally reported silver particles and powder, the particles are synthesized and then subjected to washing with an appropriate solvent. On the other hand, since the concentrate of the present invention is converted into a composition as it is without washing, the process can be shortened, thereby giving an effect of high productivity.

<pH Adjustment Process>

The composition of the present invention is characterized by once adjusting pH to 5.3 to 8.0 after the synthesis of particles and before production of the concentrate. During the synthesis of the silver nanoparticles, the reaction is caused by increasing the solution temperature and intensively stirring the system. In this case, the organic acid and derivative thereof serving as a surfactant need to be used excessively so as to suppress aggregation and binding during the synthesis of particles. Since the excess organic acid and derivative thereof have a low solubility in water which is a main solvent, the particle has a structure, in which almost all of them including an excess is arranged around the particles. For this reason, the excess organic acid decreases dispersibility of the silver particles, and high boiling point of the organic acid prevents sintering of the silver particles.

The organic acid and derivative thereof are characterized by increasing their solubility in the solvent (water) with increasing the pH of the solvent. The present inventors have found that when a concentrate is obtained at room temperature, the pH is set to a range of 5.3 to 8.0, thereby dissociating the excess organic acid and derivative thereof which are arranged around the particles from the periphery of particles, and believed that this is to be used. In other words, the excess organic acid and derivative thereof are intentionally dissociated from the periphery of silver particles by the pH adjustment. Thereby, they are allowed to be dissolved in the solvent, and part of substances which is not dissolved in the solvent is separated as an emulsion of water and the organic acid and derivative thereof at an upper part of the composition.

The pH adjustment process may be performed at the same time as, or prior to, the separation process. Therefore, standing may be allowed to separate the solution into a supernatant and silver nanoparticles, the supernatant may be removed, and the pH adjustment process may be performed to dissociate the excess organic acid from the surface of the silver particles. Alternatively, while or before the separation process is performed by standing, the pH may be adjusted, and the solvent and the excess organic acid which is dissociated from the silver particle may be removed as a supernatant. As described above, the excess organic acid is dissociated from the periphery of silver particles, and then the solution is concentrated to the concentration of silver to be aimed, thereby obtaining a concentrate. The inventors have found that, when the concentrate is used to prepare a composition, the composition is excellent in dispersibility and low-temperature sintering property.

A plurality of pH adjustment processes may be performed in combination with the separation process. For example, the separation process is first performed for a predetermined time, the pH adjustment process is performed when the concentration is promoted to a certain extent, and then the separation process is performed by standing. A series of processes are performed a plurality of times. In this case, the separation process after the pH adjustment also has an object in which the silver nanoparticles are precipitated and dissociation of organic acid from the periphery of silver particles is promoted. The separation process may include such an object.

As for the range of pH, the following findings are given. When the pH is equal to or lower than 5.2, an organic acid and a derivative thereof have a low solubility in water. Therefore, an excess amount of the organic acid and derivative thereof is removed with a low removal efficiency. When the pH is equal to or greater than 8.1, the solubility of the organic acid and derivative thereof in water is too high. Therefore, since the amount of the organic acid and derivative thereof around the particles is insufficient by the amount required for dispersion of the particles one another, it is found that the particles cause aggregation and binding and the solution is not suitable for a coating.

<Dispersion Process>

Nitric acid having an effect of a sintering promoter is added so as to be a preferable range to the concentrate, in which the silver nanoparticle is increased to an appropriate concentration by the separation process. Thereafter, ammonia and nitric acid are added so that the concentrate provides an appropriate pH, ammonia concentration, and nitric acid concentration. Then, in order to set the concentration to a concentration suitable for a final targeted silver concentration, the supernatant is added to make fine adjustment. A high $T_g$ resin polymer for improving adhesion to the above-described targeted base material and water-dispersible polymer for viscosity adjustment (thickener) are added to obtain a silver nanoparticle composition.

The adjusted composition is applied to a base material by a printing method. The printing method can be selected from flexographic printing, gravure printing, screen printing, offset printing, dispenser, spraying, and the like, depending on the object of application.

<Evaluation of Primary Particle Average Diameter>

As used herein, the diameter of a silver nanoparticle is referred to as a primary particle average diameter which is an average value of a primary particle diameter from a TEM image, and was measured as follows. Two parts by mass of the silver nanoparticle composition was added to a mixed solution of 96 parts by mass of cyclohexane and 2 parts by mass of oleic acid, and the resultant was subjected to ultrasonic waves to be dispersed. The dispersed solution was added dropwise to a Cu microgrid with supporting film and dried to obtain a TEM sample. A bright-field image, in which particles on the formed microgrid were observed with a transmission electron microscopy (JEM-100CX Mark-II type, manufactured by JEOL Ltd.) at an accelerating voltage of 100 kV, was photographed at a magnification of 300,000.

In calculation of the primary particle average diameter, an image analysis software (A-zo Kun (registered trademark), manufactured by Asahi Kasei Engineering Corporation) was used. The image analysis software discriminates each particle with the light and dark shading of color. Circular particle analysis to the TEM image at a magnification of 300,000 was performed under the conditions of "brightness of particle" of "dark," "noise cancelling filter" of "presence," "circular threshold" of "20," and "overlap degree" of "50" to measure 200 or more particles as a primary particle and determine a number average diameter, which was regarded as a primary particle average diameter. When a large number of aggregated particles and deformed particles were present in the TEM image, it was considered as being immeasurable.

<Measurement of Ammonia and Nitric Acid Concentrations>

The composition was subjected to solid-liquid separation by a membrane filter and a super-centrifugal separator, and the liquid was subjected to ion chromatograph to measure the concentrations of ammonia and nitric acid in the composition.

<Measurement of Organic Acid>

The quantitative determination of the organic acid in the composition was performed by adding an excess amount of nitric acid to the composition, heating a mixture, completely dissolving a metal component, performing n-hexane extraction four times, and performing GC-MS.

Rheological properties of the composition were evaluated with a rheometer manufactured by HAAKE (trade name: RheoStress 600) and the used corn was C35/2. Specifically, viscosities at a share rate of $10 \ s^{-1}$ and $1000 \ s^{-1}$ were measured. Thixotropy which shows a degree of nature for increasing fluidity by stirring and returning the viscosity to its original state by standing was defined as (viscosity at $10 \ s^{-1}$)/(viscosity at $1000 \ s^{-1}$) and evaluated.

<Manufacture of Conductive Film>

The silver nanoparticle composition was applied to a base material with a flexo proof (manufactured by RK Print Coat Instruments, type: ESI12, anilox: 200 lines).

As a setting of the flexo proof, pressures for the anilox roll and the rubber plate were adjusted. Pressure adjustment was performed by pressing the anilox and rubber plate using adjustment knobs at both ends by 0.05 to 0.10 mm from a position where the anilox and rubber plate were in contact with each other. Approximately 1 ml of the composition was then dropped on the anilox and applied for about 1 second.

Immediately after the application, firing was performed for a predetermined time using a hot plate at a predetermined temperature. In order to keep contact between the base material and the hot plate favorable during the firing, an unprinted portion of the base material was first pressed against the hot plate to promote firing. When the composition was not transcribed into Bemcot, the whole base material was pressed against the hot plate with the Bemcot to perform the firing.

Figure 5:
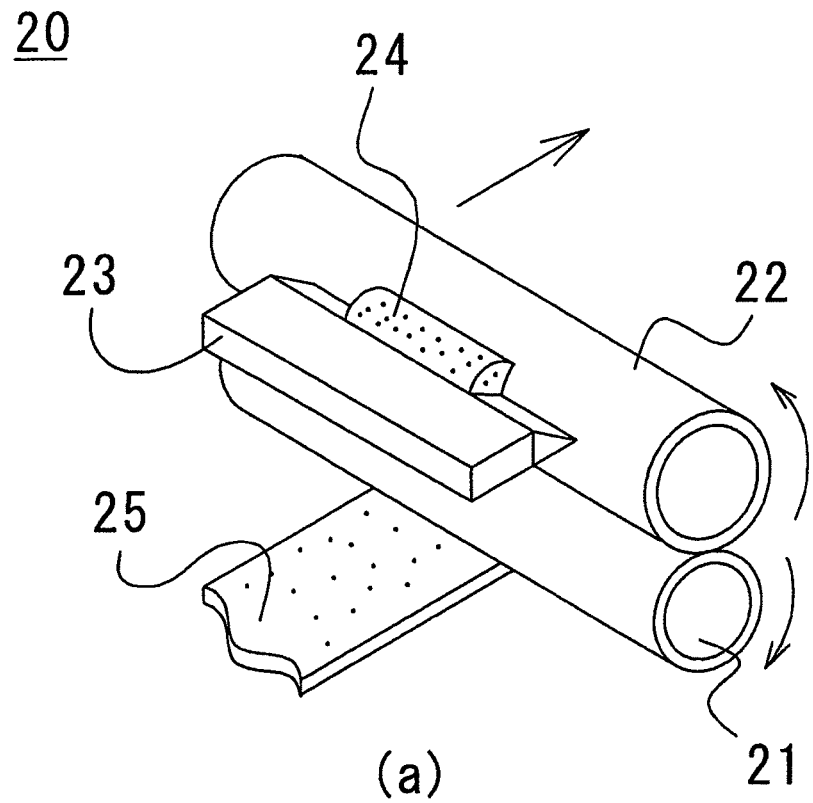
FIG. 5 is a view showing the configuration of a simple applying device.
Figure 5:
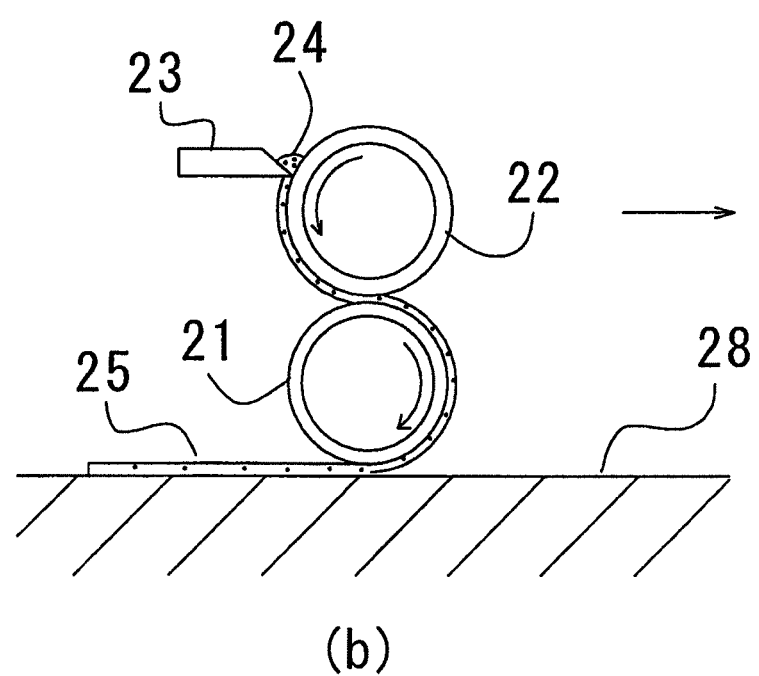

FIG. 5 shows schematic views of the Flexo proof. FIG. 5(a) shows a perspective view illustrating a process during application and FIG. 5(b) shows a side view at that time. In a flexo proof 20, an anilox roller 22 is arranged above a cylinder rubber plate 21 and a doctor blade 23 is mounted on the anilox roller 22. Distances between the rubber plate 21 and the anilox roller 22 and between the doctor blade 23 and the anilox roller 22 are each constructed so as to be adjusted as described above. A coating 24 is dropped between the doctor blade 23 and the anilox roller 22. The rubber plate 21 is pressed against a base material 28 and an entirety is pulled in the direction of an arrow as it is. The rubber plate 21 rotates and the anilox roller 22 inversely rotates with the rotation of the rubber plate 21.

The coating 24 adheres to the surface of the anilox roller 22 in a fixed film thickness in between the rotating anilox roller 22 and the doctor blade 23 and is transcribed into the rubber plate 21 through a surface in contact with the rubber plate 21. The coating 23 transcribed into the rubber plate 21 is transferred to the base material 28 through the rotation of the rubber plate 21, and transcribed into the base material 28 to obtain a coated film 25. As described above, the coating 24 is applied by the flexo proof 20. If this type of applying device is absent, an applying device having the configuration shown in FIG. 5 may be used in manufacturing a conductive film for measurement of resistance.

<Surface Resistivity>

After the application, heat treatment is performed at a predetermined temperature for a predetermined time. The heat treatment sinters and integrates the silver nanoparticles to express conductivity. Conductivity was evaluated using a four probe method as a surface resistivity (unit: Ω/square or Ω/sq., ohm per square is read, which means resistance per unit area, is referred to as sheet resistance or simply as surface resistance, and is used in a coated film and thin film field).

<Volume Resistivity>

The relationship between the volume resistivity and the surface resistivity is volume resistivity=surface resistivity× thickness of sample. The volume resistivity was calculated from the above surface resistivity and the thickness of a sample obtained with a laser microscope. In Examples, mirror coated paper (manufactured by Oji paper Co., Ltd.) was basically used as a base material. When the paper was a base material, soak of the composition to the base material and deteriorated surface roughness made it difficult to measure the thickness of the sample with a laser microscope. Therefore, when the volume resistivity was determined, a PET (polyethylene terephthalate) film (Melinex (registered trademark) 545 manufactured by DuPont Teijin Films Ltd.) was used as a base material. In Examples of the description, from the viewpoint of measurement of film thicknesses, a PET substrate was used in the measurement of volume resistivity. However, any base materials can be used, particularly without limiting to PET as long as the film thickness can be measured through a film thickness measuring method using X-ray fluorescence.

<Evaluation of Adhesion>

Adhesion of a silver film obtained by firing after the application to a base material and the base material was evaluated through a cross-cut method. A mending tape (manufactured by 3M) was used as a tape. The cross-cut method was performed with reference to JIS 56000-5-6. When the base material was paper, the tape was separated over a few seconds, and the cross-cut method was performed so that the base material itself was not destroyed. A determination was visually made. FIG. 1 shows the criterion. The criterion is six-grade evaluation of 0 to 5. 0 shows a state where the film was not peeled from the base material. 5 shows a state where the film was almost peeled.

<Measurement of pH>

The pH was measured by means of a handy pH/Do meter: D-55 (manufactured by HORIBA, Ltd.,) or equivalent of this meter according to the pH measurement method in JIS Z 8802 (1984). 9611-10D (manufactured by HORIBA, Ltd.,) was used as a pH electrode. Two-point calibration was performed using standard solutions having a pH of 6.86 and 4.01, respectively before measurement. When pH was measured, the solution was sufficiently stirred and then stood for about 30 seconds to about 1 minute, an inspection terminal (pH electrode) was immersed in the solution to read values of meter.

EXAMPLES

Examples 1 to 8 and Comparative Examples 1 to 4

Effects of pH

Example 1

<Preparation of Raw Material Liquid>

As a raw material liquid A, 0.31 kg of 28% by mass aqueous ammonia, and 0.36 kg of heptanoic acid were mixed with 1.2 kg of ion-exchanged water.

As a raw material liquid B, 0.39 kg of 85% by mass hydrous hydrazine was diluted with 1.0 kg of ion-exchanged water.

As a raw material liquid C, 1.4 kg of silver nitrate crystal was dissolved in 1.2 kg of warmed ion-exchanged water to prepare a solution.

<Synthesis Reaction of Silver Nanoparticle>

Into a reaction vessel equipped with a reflux condenser, 11 kg of ion-exchanged water was placed to suppress volatilization of contents during the reaction, and was heated while stirring. When the temperature of ion-exchanged water fell within 30 to 50° C., the raw material liquids A, B, and C were sequentially added while stirring to initiate the reaction.

<Concentrate>

The reaction vessel was cooled and controlled so that the temperature during the reaction was not higher than 60° C. The condenser for cooling the inside of the reaction vessel was mounted in the reaction vessel to perform cooling. The reaction was completed at a time when increase in temperature due to reaction heat was stopped even if cooling of the reaction vessel was stopped. Thereafter, the reaction solution was transferred to another container, and the container stood for 24 hours to condense the reaction product.

After standing for 24 hours, a supernatant was removed. The obtained concentrate was poured in an airtight bottle with a lid so as not to volatilize components during storage, and the bottle stood at a cool and dark place for 3 months to condense the reaction product more. Thereafter, a supernatant was moderately removed to obtain a further condensed reaction product. Both the standing for 24 hours and standing for 3 months are classified into a separation process.

<pH Adjustment>

In order to promote the dissociation of excess heptanoic acid arranged around the particles, aqueous ammonia was added to the concentrate to adjust the pH of the concentrate to 7.3. Immediately after the adjustment, the concentrate stood for additional 3 or 4 days to promote the dissociation of excess heptanoic acid. After standing for 3 or 4 days, the obtained supernatant was removed. When a separated emulsion of water and the organic acid and derivative thereof was seemed on the top of the supernatant, it was further removed. Thus, a final concentrate having a silver concentration required for formation of a composition was obtained. The supernatant obtained during the separation was used to adjust the silver concentration of the composition. This is because use of the supernatant for the adjustment of the silver concentration does not change the pH of the composition and changes such as aggregation of silver nanoparticles do not cause.

<Conversion into Composition>

A vinyl chloride copolymer latex having a $T_g$ of 73° C. was added as a polymer having a high $T_g$ to the concentrate of which pH was adjusted, in order to increase the adhesion to a base material. In addition, a polyurethane thickener for adjusting the viscosity, propylene glycol as a wetting agent, and the supernatant obtained after the pH adjustment for adjusting the silver concentration were added and stirred to obtain a composition of Example 1 having 60% by mass of silver, 3% by mass of vinyl chloride copolymer latex ($T_g$=73° C.), 2% by mass of polyurethane thickener, and 2.5% by mass of propylene glycol. The pH of the composition was 7.3, or the same as the pH of concentrate after the pH adjustment. The amounts of heptanoic acid in the concentrate and in the supernatant were measured separately, and the amount of heptanoic acid in the composition was adjusted from these measured amounts. These characteristics are shown in Table 1.

Examples 2 to 7 and Comparative Examples 1 and 2

Compositions of Examples 2 to 7 and Comparative Examples 1 and 2 were obtained in the same manner as in Example 1, except that either aqueous ammonia or nitric acid was added in the pH adjustment process and the pH was adjusted to the pH of Examples 2 to 7 and Comparative Examples 1 and 2 in Table 1. These characteristics are shown in Table 1. Since the supernatant obtained in the separation process after the pH adjustment was used to adjust the silver concentration of the composition in the same manner as in Example 1, the pH of the composition was the same value as the pH after the pH adjustment.

Comparative Examples 3 and 4

Compositions of Comparative Examples 3 and 4 were obtained in the same preparation methods as in Comparative Examples 1 and 2, respectively, except that the silver concentration with respect to the entire composition was adjusted to 40% by mass. The pH of the compositions of Comparative Examples 3 and 4 were 5.2 and 8.1, respectively. These characteristics are shown in Table 1.

Example 8 and Comparative Example 5

The composition described in Example 2 was stirred by a stirrer at 300 rpm. It was confirmed that when stirring was continued, an ammonia component in a liquid was volatilized, and the pH was decreased with longer stirring time. According to the stirring operation, samples of Example 8 and Comparative Example 5 having a pH of 5.3 and 5.2, respectively, were obtained. That is, the pH during condensation in Example 8 and Comparative Example 5 was 6.8 which was the same as in Example 2, but the samples had a different final pH as the composition. These characteristics are shown in Table 1.

TABLE 1

| | Latex $T_g$ (° C.) | Ag concentration of composition (% by mass) | pH of composition | Heptanoic acid with respect to silver (% by mass) | Ammonia component in composition (% by mass) | Nitric acid component in composition (% by mass) | Primary particle size (nm) | Viscosity ① at share rate of 10 (1/s) (cp) | Viscosity ② at share rate of 1000 (1/s) (cp) | Thixotropic ratio (Viscosity ①/②) | Surface resistivity (Ω/sq.) | Adhesion crosscut method |
|---|---|---|---|---|---|---|---|---|---|---|---|---|
| Example 1 | 73 | 60 | 7.3 | 6 | 0.5 | 1.0 | 10 | 1100 | 180 | 6 | 0.5 | 0 |
| Example 2 | 73 | 60 | 6.8 | 6 | 0.5 | 1.0 | 14 | 685 | 66 | 10 | 0.7 | 0 |
| Example 3 | 73 | 60 | 6.4 | 5 | 0.4 | 1.0 | 8 | 400 | 91 | 4 | 0.7 | 0 |
| Example 4 | 73 | 60 | 6.1 | 4 | 0.4 | 1.0 | 20 | 476 | 114 | 4 | 0.6 | 0 |
| Example 5 | 73 | 60 | 5.8 | 5 | 0.4 | 1.0 | 18 | 676 | 110 | 6 | 0.8 | 0 |
| Example 6 | 73 | 60 | 5.7 | 6 | 0.4 | 1.0 | 9 | 837 | 67 | 13 | 1.1 | 0 |
| Example 7 | 73 | 60 | 5.4 | 8 | 0.3 | 1.1 | 31 | 1800 | 62 | 29 | 1.1 | 0 |
| Example 8 | 73 | 60 | 5.3 | 6 | 0.3 | 1.0 | 14 | 2400 | 140 | 17 | 0.6 | 0 |
| Comparative Example 1 | 73 | 60 | 5.2 | 10 | 0.3 | 0.9 | 15 | — | — | — | * | * |
| Comparative Example 2 | 73 | 60 | 8.1 | 5 | 0.6 | 1.0 | 22 | 16000 | 72 | 222 | * | 3 |
| Comparative Example 3 | 73 | 40 | 5.2 | 11 | 0.3 | 0.9 | 29 | 6400 | 80 | 80 | Over range | 2 |
| Comparative Example 4 | 73 | 40 | 8.1 | 6 | 0.6 | 1.0 | 8 | 460 | 23 | 20 | Over range | 2 |
| Comparative Example 5 | 73 | 60 | 5.2 | 6 | 0.3 | 0.9 | 14 | 10300 | 320 | 32 | * | 3 |

* Imperfect application and cannot be evaluated

The thus obtained compositions in Examples 1 to 8 and Comparative Examples 1 to 5 were applied to mirror coated paper (manufactured by Oji paper Co., Ltd.) with a flexo proof (manufactured by RK Print Coat Instruments, type: ESI12, anilox: 200 lines). The coated film was heat treated at 60° C. for 15 seconds to form a fired film. The imparted surface resistivity and adhesion are shown in Table 1.

From the comparison of Examples 1 to 8 and Comparative Examples 1 to 5, it was observed that the pH of ink (composition) remarkably influenced rheological properties of ink, and when the pH was equal to or lower than 5.2 or equal to or greater than 8.1, the viscosity, in particular, at a low share rate ($10 \ s^{-1}$) was largely increased.

In Examples 1 to 8, it was confirmed that favorable application to a base material was possible, and after the heat treatment, favorable conductivity and adhesion to a base material were stably imparted.

In Comparative Example 1, since the composition did not have a fluidity, the viscosity could not be measured. Further, the composition could not be applied to a base material. In Comparative Examples 2 and 5, the compositions could be applied to a base material, but the applied compositions showed uneven thicknesses and the conductivity could not be imparted. It was confirmed that adhesion was also insufficient.

Since the viscosities in Comparative Examples 1 and 2 were too high, Comparative Examples 3 and 4 in which the silver concentration was decreased to 40% by mass were prepared. These compositions could be applied to a base material, but by heat treatment at 60° C. for 15 seconds, the conductivity could not be imparted.

Comparative Examples 3 and 4, in the case of heat treatment condition of 60° C. and 15 seconds, did not show conductivity. However, in the case of heat treatment condition of 140° C. and 30 seconds, the conductive films could be obtained. Specifically, the surface resistivities in Comparative Examples 3 and 4 were 5.8 and 4.4 Ω/square, respectively. It was confirmed that the adhesion of these films was also insufficient.

From the above results, it is confirmed that if a composition having a pH of 5.3 to 8.0 is prepared, the composition is excellent in low-temperature sintering property. When the composition having a pH out of the range of the present invention (5.3 to 8.0) was prepared and stood for 24 hours after the preparation, the precipitation of particles and the supernatant due to aggregation were observed. However, in the composition having a pH falling within the range, they were not observed.

<Volume Resistivity>
<As to Example 1>

The obtained composition in Example 1 was applied to a PET (polyethylene terephthalate) film (Melinex (registered trademark) 545 manufactured by DuPont Teijin Films Ltd.) with a flexo proof (manufactured by RK Print Coat Instruments, type: ESI12, anilox: 200 lines).

When the obtained coated film was fired at 120° C. for 30 seconds, a fired film had a thickness of 1.3 μm and a volume resistivity of $2 \times 10^{-5}$ Ω·cm. When another coated film was fired at 100° C. for 30 seconds, a fired film had a thickness of 1.1 μm and a volume resistivity of $2 \times 10^{-5}$ Ω·cm. It was confirmed that heat treatment at a low temperature in a very short time was performed to obtain a composition which was equal to or less than the volume resistivity, as compared with the conventional resin-hardening silver paste.

Examples 9 to 12 and Comparative Examples 5 and 6

Effects of Amount of Heptanoic Acid

Example 9

<pH Adjustment>

The operation in Example 1 was repeated until a concentrate was obtained. In order to promote the dissociation of excess heptanoic acid arranged around the particles, aqueous ammonia was added to the above concentrate to adjust the pH of the concentrate to about 6.0. Immediately after the adjustment, the concentrate stood for additional 3 or 4 days to promote the dissociation of excess heptanoic acid. After standing for 3 or 4 days, the obtained supernatant was removed. When a separated emulsion of water and the organic acid and derivative thereof was seemed on the top of the supernatant, it was further removed. Thus, a final concentrate having a silver concentration required for formation of a composition was obtained. The supernatant obtained during the separation was used to adjust the silver concentration of the composition.

<Conversion into Composition>

A vinyl chloride copolymer latex having a $T_g$ of 40° C. was added as a polymer having a high $T_g$ to the concentrate of which pH was adjusted to about 6.0, in order to increase the adhesion to a base material. In addition, a polyurethane thickener for adjusting the viscosity, propylene glycol as a wetting agent, and the supernatant obtained after the pH adjustment for adjusting the silver concentration were added and stirred to obtain a composition of Example 9 having 60% by mass of silver, 3% by mass of vinyl chloride copolymer latex ($T_g$=40° C.), 2% by mass of polyurethane thickener, 2.5% by mass of propylene glycol, and 4% by mass of heptanoic acid (the concentration of heptanoic acid is indicated as "6% by mass" as a ratio with respect to silver in Table 2) with respect to the entire amount of the composition. The pH of the composition was 5.9. The characteristics are shown in Table 2.

Example 10

A composition of Example 10 was obtained in the same manner as in Example 9, except that the amount of heptanoic acid was 0.72 kg as double volume in a raw material preparation process. The pH of the composition was 6.0. The characteristics are shown in Table 2.

Example 11

<Conversion into Composition>

The same operation as in Example 9 was performed until conversion into composition. A vinyl chloride copolymer latex having a $T_g$ of 40° C. was added as a polymer having a high $T_g$ to the concentrate of which pH was adjusted to about 6.0, to increase the adhesion to a base material. In addition, a polyurethane thickener for adjusting the viscosity, propylene glycol as a wetting agent, and heptanoic acid were added so that the concentration of heptanoic acid in the composition was 10% by mass (it is indicated as "14% by mass" as a ratio with respect to silver in Table 2).

The supernatant obtained after the pH adjustment was added to adjust the silver concentration, and stirred. Ammonia was then added to adjust the pH to about 6.0 again since the addition of heptanoic acid decreased pH. A composition of Example 11 having 60% by mass of silver, 3% by mass of vinyl chloride copolymer latex ($T_9$=0° C.), 2% by mass of polyurethane thickener, and 2.5% by mass of propylene glycol, and the concentration of heptanoic acid with respect to silver of 14% by mass was obtained. The pH of the composition was 6.1. The characteristics are shown in Table 2.

Example 12

<Conversion into Composition>

A composition of Example 12 was obtained in the same manner as in Example 11, except that the amount of heptanoic acid was increased in the conversion process into composition so that the concentration of heptanoic acid with respect to silver was 20% by mass. The characteristics are shown in Table 2.

Comparative Example 6

Synthesis of particles and concentration were performed according the conditions in Example 1, except that the amount of heptanoic acid was changed to 0.18 kg as a half volume in the raw material preparation process.

<pH Adjustment>

As in Example 9, in order to promote the dissociation of excess heptanoic acid arranged around the particles, aqueous ammonia was added to the above-described concentrate to adjust the pH of the concentrate to about 6.0. Immediately after the adjustment, the concentrate stood for additional 3 or 4 days to promote the dissociation of excess heptanoic acid. After standing for 3 or 4 days, the obtained supernatant was removed. When a separated emulsion of water and the organic acid and derivative thereof was seemed on the top of the supernatant, it was further removed. Thus, a final concentrate having a silver concentration required for formation of a composition was obtained. The supernatant obtained during the separation was used to adjust the silver concentration of the composition.

<Conversion into Composition>

Additives were added and stirred in the same manner as in Example 9 to obtain a composition of Comparative Example 6 having a concentration of heptanoic acid of 1% by mass with respect to silver. The characteristics are shown in Table 2.

Comparative Example 7

A composition of Comparative Example 7 was obtained in the same manner as in Example 11, except that the amount of heptanoic acid was increased in the conversion process into composition so that the concentration of heptanoic acid with respect to silver was 25% by mass. The characteristics are shown in Table 2.

The thus obtained compositions in Examples 9 to 12 and Comparative Examples 6 and 7 were applied to mirror coated paper (manufactured by Oji paper Co., Ltd.) with a flexo proof (manufactured by RK Print Coat Instruments, type: ESI12, anilox: 200 lines). The coated film was heat treated at 60° C. for 15 seconds to form a fired film. The obtained surface resistivity and adhesion are shown in Table 2.

From the comparison of Examples 9 to 12 and Comparative Examples 6 and 7, it is found that the concentration of heptanoic acid in the composition remarkably influences the resistance of the conductive film. In Examples 9 to 12 in which the concentration of heptanoic acid with respect to silver in the composition fell within the range of 2 to 20% by mass, conductive films having favorable conductivity and adhesion were obtained.

In Comparative Example 6 in which the concentration of heptanoic acid with respect to silver in the composition was 1% by mass, since particles were aggressively aggregated, although a composition was prepared, the composition could not be applied to a base material. This leads to surmise that since the amount of heptanoic acid for protecting silver nanoparticles is small, the dispersion state cannot be kept to generate very aggressive aggregation.

In Comparative Example 7 in which the concentration of heptanoic acid with respect to silver in the composition was more than 20% by mass, although a composition could be prepared and applied, a film after heat treatment could not have resistance and the adhesion was very poor.

This is considered to be due to remarkable inhibition of sintering in synthesis of silver nanoparticles during heat treatment when the particles excessively existed since the boiling point of heptanoic acid is a high temperature of 223° C.

In order to promote the dissociation of excess heptanoic acid arranged around the particles, aqueous ammonia was added to the above concentrate to adjust the pH of the concentrate to about 6.0. Thereafter, in Examples 11 and 12 and Comparative Example 7, heptanoic acid was added to the composition to check the change of low-temperature sintering property. In Examples 11 and 12, it was not confirmed that the addition of heptanoic acid largely increased viscosity and that low-temperature sintering property remarkably deteriorated as in Comparative Example 1. This suggests that decreased solubility of heptanoic acid in a solvent and arrangement of excess heptanoic acid around particles adversely affects increase in viscosity and deterioration of low-temperature sintering property.

When heptanoic acid can be dissolved in a solvent and the amount of heptanoic acid around particles is appropriate, although heptanoic acid is soluble in the solvent to some extent, the characteristics are assumed not to be adversely affected. The heptanoic acid molecules arranged around the

TABLE 2

| | Latex $T_g$ (° C.) | Ag concentration of composition (% by mass) | pH of composition | Heptanoic acid with respect to silver (% by mass) | Ammonia component in composition (% by mass) | Nitric acid component in composition (% by mass) | Surface resistivity (Ω/sq.) | Adhesion cross-cut method |
|---|---|---|---|---|---|---|---|---|
| Example 9 | 40 | 60 | 5.9 | 6 | 0.4 | 1.0 | 1.7 | 0 |
| Example 10 | 40 | 60 | 6.0 | 7 | 0.4 | 1.0 | 1.2 | 0 |
| Example 11 | 40 | 60 | 6.1 | 14 | 0.4 | 1.0 | 2.5 | 0 |
| Example 12 | 40 | 60 | 5.8 | 20 | 0.5 | 1.0 | 7.5 | 0 |
| Comparative Example 6 | 40 | 60 | 5.9 | 1 | 0.4 | 1.0 | * | * |
| Comparative Example 7 | 40 | 60 | 6.0 | 25 | 0.6 | 1.1 | Over range | 5 |

* cannot be applied and accordingly cannot be evaluated particles reversibly repeat desorption from and adsorption to the particles. Therefore, from the viewpoint of storage stability, or the like, heptanoic acid is assumed to be desirable to exist in the solvent to some extent.

The concentration of heptanoic acid with respect to silver is preferably within a range of 2% by mass or more and 20% by mass or less. It is more preferably within a range of 4% by mass or more and 15% by mass or less.

Examples 13 to 15 and Comparative Examples 8

Effects of Concentration of Ammonia and Nitric Acid in Composition

Example 13

<pH Adjustment>

The operation in Example 1 was repeated until a concentrate was obtained. Aqueous ammonia and nitric acid were added to the concentrate obtained by standing for 3 months to adjust the pH of the concentrate to about 7.0. Immediately after the adjustment, the concentrate stood for additional 3 or 4 days to promote the dissociation of excess heptanoic acid. After standing for 3 or 4 days, the obtained supernatant was removed. When a separated emulsion of water and the organic acid and derivative thereof was seemed on the top of the supernatant, it was further removed. Thus, a final concentrate was obtained. The supernatant obtained during the separation was used to adjust the silver concentration of the composition.

<Conversion into Composition>

A vinyl chloride copolymer latex having a $T_g$ of 7° C. was added as a polymer having a high $T_g$ to the concentrate of which pH was adjusted to about 7.0, to increase the adhesion to a base material. In addition, a polyurethane thickener for adjusting the viscosity, propylene glycol as a wetting agent, and the supernatant obtained after the pH adjustment for adjusting the silver concentration were added and stirred to obtain a composition of Example 13 having 60% by mass of silver, 3% by mass of vinyl chloride copolymer latex ($T_g$=7° C.), 2% by mass of polyurethane thickener, 2.5% by mass of propylene glycol, 0.4% by mass of ammonia component, and 1.0% by mass of nitric acid component. The pH of the composition was 7.0. The characteristics are shown in Table 3.

Example 14

A composition of Example 14 having an ammonia concentration of 0.9% by mass and 2.7% by mass nitric acid component in the composition was obtained in the same manner as in Example 13, except that nitric acid was added in an amount more than usual during the pH adjustment and then ammonia was added to adjust the pH to about 7.0 which was the same as in Example 13. The pH of the composition was 7.3. The characteristics are shown in Table 3.

Example 15

A composition of Example 15 having an ammonia concentration of 0.2% by mass and a nitric acid component concentration of 0.6% by mass was obtained in the same manner as in Example 13, except that during conversion into composition, pure water, not the supernatant obtained during concentration, was used to adjust a silver concentration. The pH of the composition was 7.2. The characteristics are shown in Table 3.

Comparative Example 8

The operation in Example 1 was repeated until a concentrate was obtained. The concentrate obtained by standing for 3 months was filtered and washed to obtain a concentrate. The concentrate was used and a vinyl chloride copolymer latex having a $T_g$ of 7° C. was added as a polymer having a high $T_g$ to increase the adhesion to a base material. In addition, a polyurethane thickener for adjusting the viscosity, and propylene glycol as a wetting agent were added. In order to adjust the silver concentration, pure water was added and stirred to obtain a composition of Comparative Example 8. In the composition, the concentrations of ammonia and nitric acid component are 0.1% by mass or less and 0.1% by mass, respectively. The pH of the composition was 7.0. The characteristics are shown in Table 3.

TABLE 3

| | Latex $T_g$ (° C.) | Ag concentration of composition (% by mass) | pH of composition | Heptanoic acid with respect to silver (% by mass) | Ammonia component in composition (% by mass) | Nitric acid component in composition (% by mass) | Surface resistivity (Ω/sq.) | Adhesion cross-cut method |
|---|---|---|---|---|---|---|---|---|
| Example 13 | 7 | 60 | 7.0 | 10 | 0.4 | 1.0 | 1.7 | 0 |
| Example 14 | 7 | 60 | 7.3 | 9 | 0.9 | 2.7 | 2.1 | 0 |
| Example 15 | 7 | 60 | 7.2 | 12 | 0.2 | 0.6 | 9.8 | 0 |
| Comparative Example 8 | 7 | 60 | 7.0 | 6 | <0.1 | 0.1 | Over range | 3 |

The thus obtained compositions in Examples 13 to 15 and Comparative Example 8 were applied to mirror coated paper (manufactured by Oji paper Co., Ltd.) with a flexo proof (manufactured by RK Print Coat Instruments, type: ESI12, anilox: 200 lines). The obtained coated film was heat treated at 60° C. for 15 seconds to form a fired film. The obtained surface resistivity and adhesion are shown in Table 3.

From the comparison of Examples 13 to 15 and Comparative Example 8, it is found that the ammonia concentration in the composition and heptanoic acid in the composition remarkably influence the resistance of conductive film and secondary aggregate diameter. When the ammonia concentration and the concentration of heptanoic acid in the composition was 0.1% by mass and 0.1% by mass or less, respectively, particles were aggressively aggregated. In this case, when the composition was applied, the quality was poor, the obtained film had many holes, and even coated film was not obtained. For this reason, when the film was fired, resistance and favorable adhesion were not obtained.

Examples 16 to 19 and Comparative Example 9

Difference of Glass Transition Temperature ($T_g$)

<pH Adjustment>

The operation in Example 1 was repeated until a concentrate was obtained. Aqueous ammonia was added to the concentrate obtained by standing to adjust the pH to about 7.0. Immediately after the adjustment, the concentrate stood for additional 3 or 4 days to promote the dissociation of excess heptanoic acid. After standing for 3 or 4 days, the obtained supernatant was removed. When a separated emulsion of water and the organic acid and derivative thereof was seemed on the top of the supernatant, it was further removed. Thus, a final concentrate was obtained. The supernatant obtained during the separation was used to adjust the silver concentration of the composition.

<Conversion into Composition>

A vinyl chloride copolymer latex having different glass transition temperatures ($T_g$) was added as a polymer having a high $T_g$ to the concentrate of which pH was adjusted to about 7.0, in order to increase the adhesion to a base material. In addition, a polyurethane thickener for adjusting the viscosity, propylene glycol as a wetting agent, and the supernatant obtained after the pH adjustment for adjusting the silver concentration were added and stirred to obtain compositions of Examples 16 to 19 and Comparative Example 9 having 60% by mass of silver, 3% by mass of vinyl chloride copolymer latex, 2% by mass of polyurethane thickener, and 2.5% by mass of propylene glycol, and including vinyl chloride copolymer having various $T_g$. These characteristics are shown in Table 4.

TABLE 4

| | Latex $T_g$ (° C.) | Ag concentration of composition (% by mass) | pH of composition | Heptanoic acid with respect to silver (% by mass) | Ammonia component in composition (% by mass) | Nitric acid component in composition (% by mass) | Surface resistivity (Ω/sq.) | Adhesion cross-cut method |
|---|---|---|---|---|---|---|---|---|
| Example 16 | 7 | 60 | 7.1 | 6 | 0.5 | 1.0 | 1.2 | 0 |
| Example 17 | 40 | 60 | 7.0 | 6 | 0.5 | 1 0 | 0.7 | 0 |
| Example 18 | 73 | 60 | 6.9 | 6 | 0.5 | 1.0 | 0.9 | 0 |
| Example 19 | 75 | 60 | 7.2 | 6 | 0.5 | 1.0 | 1.1 | 0 |
| Comparative Example 9 | −3 | 60 | 6.8 | 6 | 0.5 | 1.0 | Over range | 0 |

The thus obtained compositions in Examples 16 to 19 and Comparative Example 9 were applied to mirror coated paper (manufactured by Oji paper Co., Ltd.) with a flexo proof (manufactured by RK Print Coat Instruments, type: ESI12, anilox: 200 lines). The obtained coated film was heat treated at 60° C. for 15 seconds to form a fired film. The obtained surface resistivity and adhesion are shown in Table 4.

From the comparison of Examples 16 to 19 and Comparative Example 9, it is found that $T_g$ of vinyl chloride copolymer latex to be added to improve the adhesion to a base material remarkably influences the resistance of the conductive film closely. When $T_g$ is lower than 0° C., it is confirmed that resistance is abruptly increased. This is considered that when $T_g$ is too low, polymers are likely to adhere to the surface of silver nanoparticles during storage of the composition or printing, and thus sintering is inhibited during heat treatment.

Examples 20 to 26 and Comparative Examples 10 and 11

Others (Different Polymer and Silver Concentration)

Example 20

A composition of Example 20 was obtained in the same manner as in Example 16, except that a vinyl chloride copolymer latex having $T_g$ of 75° C. was added. The characteristics are shown in Table 5.

Example 21

A composition of Example 21 was obtained in the same manner as in Example 16, except that a vinyl chloride copolymer latex having $T_g$ of 70° C. was added. The characteristics are shown in Table 5.

Example 22

A composition of Example 22 was obtained in the same manner as in Example 16, except that a vinyl acetate copolymer latex having $T_g$ of 53° C. was added. The characteristics are shown in Table 5.

Example 23

A composition of Example 23 was obtained in the same manner as in Example 16, except that a vinyl acetate homopolymer latex having $T_g$ of 65° C. was added. The characteristics are shown in Table 5.

Example 24

A composition of Example 24 was obtained in the same manner as in Example 22, except that the silver concentration was 70% by mass. The characteristics are shown in Table 5.

Example 25

A composition of Example 25 was obtained in the same manner as in Example 22, except that the silver concentration was 40% by mass. The characteristics are shown in Table 5.

Example 26

A composition of Example 26 was obtained in the same manner as in Example 22, except that the silver concentration was 30% by mass. The characteristics are shown in Table 5.

Comparative Example 10

A composition of Comparative Example 10 was obtained in the same manner as in Example 22, except that the silver concentration was 80% by mass. The characteristics are shown in Table 5.

Comparative Example 11

A composition of Comparative Example 11 was obtained in the same manner as in Example 22, except that the silver concentration was 10% by mass. The characteristics are shown in Table 5.

TABLE 5

| | Latex $T_g$ (°C.) | Type | Ag concentration of composition (% by mass) | pH of composition | Heptanoic acid with respect to silver (% by mass) | Ammonia component in composition (% by mass) | Nitric acid component in composition (% by mass) | Surface resistivity (Ω/sq.) | Adhesion cross-cut method |
|---|---|---|---|---|---|---|---|---|---|
| Example 20 | 75 | Vinyl chloride copolymer | 60 | 7.1 | 6 | 0.5 | 1.0 | 1.2 | 0 |
| Example 21 | 70 | Vinyl chloride homopolymer | 60 | 7.2 | 6 | 0.5 | 1.0 | 0.9 | 0 |
| Example 22 | 53 | Vinyl acetate copolymer | 60 | 6.8 | 6 | 0.5 | 1.0 | 1.2 | 0 |
| Example 23 | 65 | Vinyl acetate homopolymer | 60 | 7.3 | 6 | 0.5 | 1.0 | 0.7 | 0 |
| Example 24 | 53 | Vinyl acetate copolymer | 70 | 7.0 | 6 | 0.4 | 1.0 | 0.6 | 0 |
| Example 25 | 53 | Vinyl acetate copolymer | 40 | 6.8 | 7 | 0.6 | 1.1 | 4.5 | 0 |
| Example 26 | 53 | Vinyl acetate copolymer | 30 | 6.8 | 7 | 0.5 | 1.2 | 17.5 | 0 |
| Comparative Example 10 | 53 | Vinyl acetate copolymer | 80 | 6.9 | 6 | 0.4 | 1.0 | * | * |
| Comparative Example 11 | 53 | Vinyl acetate copolymer | 10 | 6.8 | 9 | 0.7 | 1.2 | Over range | 5 |

* cannot be applied and accordingly cannot be evaluated

The thus obtained compositions in Examples 20 to 26 and Comparative Examples 10 and 11 were applied to mirror coated paper (manufactured by Oji paper Co., Ltd.) with a flexo proof (manufactured by RK Print Coat Instruments, type: ESI12, anilox: 200 lines). The obtained coated film was heat treated at 60° C. for 15 seconds to form a fired film. The obtained surface resistivity and adhesion are shown in Table 5.

It was confirmed that, from results of Examples 20 to 23, the same characteristics can be obtained from various types of polymers. From the comparison of Examples 23 to 26 and Comparative Examples 10 and 11, it is found that the silver concentration remarkably influences the resistance of the conductive film.

The composition having a silver concentration of 80% by mass did not have fluidity, and could not be applied. Further, it is considered that since the composition having a silver concentration of 10% by mass has a solvent component in a too large amount, sintering insufficiently promotes under heat treating condition of 60° C. and 15 seconds, and the resistance value cannot be obtained. In addition, adhesion was also insufficient. In Examples 25 and 26, the conductivity was obtained. Even if compositions of Comparative Examples 3 and 4 having pH without an appropriate range has a silver concentration of 40% by mass, conductivity cannot be obtained. However, although a reason why conductivity is obtained in Examples 25 and 26 is not known in detail, difference of leveling due to difference of the emulsion structure of the composition and the like are considered to be associated.

Examples 27 to 34

Others

Example 27

A composition of Example 27 was obtained in the same manner as in Example 1, except that a vinyl chloride copolymer latex having a $T_g$ of 7° C. was added. The characteristics are shown in Table 6.

Examples 28 to 34

Compositions of Examples 28 to 34 were obtained in the same manner as in Example 27, except that the added amounts of latex, thickener, and propylene glycol were shown in the composition shown in Table 6. The characteristics are shown in Table 6.

TABLE 6

| | Latex $T_g$ (°C.) | Ag concentration of composition (% by mass) | pH of composition | Latex (% by mass) | Thickener (% by mass) | Propylene glycol (% by mass) | Heptanoic acid with respect to silver (% by mass) |
|---|---|---|---|---|---|---|---|
| Example 27 | 7 | 60 | 7.0 | 3.0 | 2.0 | 2.5 | 6 |
| Example 28 | 7 | 60 | 7.1 | 1.0 | 2.0 | 2.5 | 6 |
| Example 29 | 7 | 60 | 6.9 | 6.0 | 2.0 | 2.5 | 6 |
| Example 30 | 7 | 60 | 7.1 | 3.0 | 2.0 | 1.0 | 6 |
| Example 31 | 7 | 60 | 7.0 | 3.0 | 2.0 | 0.0 | 6 |
| Example 32 | 7 | 60 | 6.9 | 3.0 | 2.0 | 10.0 | 6 |
| Example 33 | 7 | 60 | 7.0 | 3.0 | 1.0 | 2.5 | 6 |
| Example 34 | 7 | 60 | 7.1 | 3.0 | 10.0 | 2.5 | 6 |

TABLE 6-continued

|  | Ammonia component in composition (% by mass) | Nitric acid component in composition (% by mass) | Viscosity ① at share rate of 10 (1/s) (cp) | Viscosity ② at share rate of 1000 (1/s) (cp) | Thixotropic ratio (Viscosity ①/②) | Surface resistivity (Ω/sq.) | Adhesion cross-cut method |
|---|---|---|---|---|---|---|---|
| Example 27 | 0.4 | 1.0 | 300 | 90 | 3 | 1.0 | 0 |
| Example 28 | 0.4 | 1.0 | 400 | 110 | 4 | 0.8 | 0 |
| Example 29 | 0.4 | 1.0 | 500 | 100 | 5 | 1.3 | 0 |
| Example 30 | 0.5 | 1.0 | 550 | 120 | 5 | 0.8 | 0 |
| Example 31 | 0.5 | 1.0 | 570 | 140 | 4 | 0.8 | 0 |
| Example 32 | 0.5 | 1.0 | 250 | 80 | 3 | 0.9 | 0 |
| Example 33 | 0.5 | 1.0 | 420 | 60 | 7 | 0.8 | 0 |
| Example 34 | 0.5 | 1.0 | 2200 | 280 | 8 | 1.7 | 0 |

The thus obtained compositions in Examples 27 to 34 were applied to mirror coated paper (manufactured by Oji paper Co., Ltd.) with a flexo proof (manufactured by RK Print Coat Instruments, type: ESI12, anilox: 200 lines). The obtained coated film was heat treated at 60° C. for 15 seconds to form a fired film. The obtained surface resistivity and adhesion are shown in Table 6.

It was confirmed that, from results of Examples 27 to 34, if the amount rate of additives changed, printing objects having favorable conductivity and adhesion is formed.

Industrial Applicability

It is considered that the silver nanoparticle composition of the present invention can be suitably used for printed electronics, and a print CPU, a print light, a print tag, an all-print display, a sensor, a print circuit board, an organic solar battery, an electronic book, a nanoimprint LED, a liquid-crystal display, a PDP display, a print memory, and RF-ID which are currently investigated can be used.

DESCRIPTION OF REFERENCE NUMERALS

1 RF-ID antenna
2 entire length
3 entire width
4 line width
5 substrate
7 IC
8 bump
10 EMI shield
11 frame
12 base material
13 conductive pattern
20 flexo proof
21 cylinder rubber plate
22 anilox roller
23 doctor blade
24 coating
25 coated film
28 base material

The invention claimed is:

1. A silver nanoparticle composition, wherein a main component of a solvent is water, a pH of the composition is within a range of 5.3 to 8.0, a silver nanoparticle included in the composition is protected by an organic acid or a derivative thereof, and a content of the organic acid or the derivative thereof is within a range of 2 to 20% by mass with respect to silver, and the composition further comprising a polymer obtained by polymerizing a monomer having a vinyl group, wherein the polymer is selected from the group consisting of a vinyl chloride homopolymer, a vinyl chloride copolymer, a vinyl acetate homopolymer, and a vinyl acetate copolymer.

2. The silver nanoparticle composition according to claim 1, wherein a content of the silver nanoparticle with respect to the entire content of the composition is within a range of 15 to 75% by mass.

3. The silver nanoparticle composition according to claim 1, wherein a content of an ammonia component present in the composition with respect to the entire content of the composition is more than 0.1% by mass.

4. The silver nanoparticle composition according to claim 1, wherein a content of a nitric acid component present in the composition with respect to the entire content of the composition is more than 0.1% by mass.

5. The silver nanoparticle composition according to claim 1, wherein a primary particle average diameter of the silver nanoparticle to be measured by a transmission electron microscope is equal to or smaller than 100 nm.

6. The silver nanoparticle composition according to claim 1, wherein the organic acid or the derivative thereof is a carboxylic acid having 5 to 8 carbon atoms or a derivative thereof.

7. The silver nanoparticle composition according to claim 1, wherein the organic acid or the derivative thereof is heptanoic acid or a derivative thereof.

8. The silver nanoparticle composition according to claim 1, comprising a polymer having a glass transition temperature ($T_g$) of 0° C. or higher and 100° C. or lower.

9. The silver nanoparticle composition according to claim 1, comprising a water-dispersible polymer having at least one or more of an OH group, a polyoxyethylene glycol group, and a polyethylene glycol group.

10. The silver nanoparticle composition according to claim 9, comprising a polymer having a urethane bond.

11. The silver nanoparticle composition according to claim 1, wherein a surface resistivity of a silver thin film obtained by applying the silver nanoparticle composition according to claim 1 to a base material and subjecting it to heat treatment in air at 60° C. for 15 seconds is equal to or less than 100 Ω/square.

12. silver thin film or a silver wiring formed using the silver nanoparticle composition according to claim 1.

13. An RF-ID antenna, wherein an antenna part of an RF-ID is formed from a silver wiring formed by applying the silver nanoparticle composition according to claim 1 to a base material and firing the wiring to be converted into silver.

14. An RF-ID inlet using the antenna according to claim 13.

15. An EMI shield, wherein a grid part of the EMI shield is formed from a wiring which is a silver wiring formed by firing a wiring formed from the silver nanoparticle composition according to claim 1 to be converted into silver.

16. An electronic circuit, wherein a wiring formed by a printing method from the silver nanoparticle composition according to claim 1 is fired to be converted into silver and form a silver wiring.

* * * * *